United States Patent [19]

James et al.

[11] Patent Number: 4,598,308
[45] Date of Patent: Jul. 1, 1986

[54] EASILY REPAIRABLE, LOW COST, HIGH SPEED ELECTROMECHANICAL ASSEMBLY OF INTEGRATED CIRCUIT DIE

[75] Inventors: Christopher D. James, La Costa; Norman E. McNeal, Carlsbad, both of Calif.

[73] Assignee: Burroughs Corporation, Detroit, Mich.

[21] Appl. No.: 596,053

[22] Filed: Apr. 2, 1984

[51] Int. Cl.⁴ ..................... H01L 23/40; H01L 23/50
[52] U.S. Cl. ........................................ 357/81; 357/75; 361/401
[58] Field of Search ............... 357/81, 75; 361/386, 361/387, 391, 401

[56] References Cited

U.S. PATENT DOCUMENTS

| | | | |
|---|---|---|---|
| 3,786,559 | 1/1974 | Smith | 357/81 |
| 4,413,308 | 11/1983 | Brown | 361/401 |
| 4,484,215 | 11/1984 | Pappas | 357/81 |

FOREIGN PATENT DOCUMENTS

| | | | |
|---|---|---|---|
| 2155702 | 5/1973 | Fed. Rep. of Germany | 361/387 |
| 0058468 | 5/1977 | Japan | 357/80 |
| 0012270 | 1/1979 | Japan | 357/81 |
| 0096757 | 6/1983 | Japan | 357/81 |

81/02367  8/1981  PCT Int'l Appl. .................. 357/75

OTHER PUBLICATIONS

Arnold et al., *Two-Stage Module Seal*, IBM Technical Disclosure Bulletin, vol. 21, No. 2 (7/1978).

*Primary Examiner*—Davie James W.
*Assistant Examiner*—Vangelis Economou
*Attorney, Agent, or Firm*—Charles J. Fassbender; Kevin R. Peterson

[57] ABSTRACT

An assembly of intercoupled integrated circuit die comprises: a substrate having a plurality of holes which extend through the substrate; each hole is of a size that is suitable to receive an integrated circuit die; a plurality of independent subassemblies are also provided; each subassembly includes an integrated circuit die and a heat sink which is attached to the back of the die and extends beyond it; each subassembly is aligned with a respective hole in the substrate such that the die lies in the hole and the heat sink extends beyond the hole and attaches to the substrate; subassemblies are interconnected by printed conductors on the substrate and discrete wires that are bonded from the front of the die to the conductors; and the die and heat sink have similar thermal expansion coefficients, while the substrate has a substantially different thermal expansion coefficient.

8 Claims, 3 Drawing Figures

EASILY REPAIRABLE, LOW COST, HIGH SPEED ELECTROMECHANICAL ASSEMBLY OF INTEGRATED CIRCUIT DIE

BACKGROUND OF THE INVENTION

This invention relates to electromechanical assemblies of packaged integrated circuits; and more particularly, it relates to such assemblies which: (1) allow defective integrated circuit die to be easily repaired, (2) allow for the assembly to be fabricated at low cost, and (3) allow signal transmission through the assembly at high speeds.

For comparison purposes, FIG. 1 illustrates a common (and perhaps the most widely used) integrated circuit package 10 of the prior art. Package 10 includes several square-shaped thin flat ceramic layers 11 that are laminated together. The bottom ceramic layer is solid, while the other layers have a central hole 12. A silicon integrated circuit die 13 is disposed in hole 12 and attached to the bottom ceramic layer. Ceramic and silicon have similar thermal expansion coefficients, and thus the die stays attached to the ceramic when package 10 is thermally cycled.

Bonding wires 14 carry signals between die 13 and conductors 15, the latter of which are screened on the internal ceramic layers 11. These conductors 15 make contact to a plurality of stiff input/output pins 16 which are attached to the top ceramic layer. To complete package 10, a heat sink (not shown) is attached to the bottom ceramic layer, and a lid (not shown) is attached to the top ceramic layer over die 13. Thereafter, a system which includes multiple integrated circuits 13 is made by soldering the pins 6 of several packages 10 into a printed circuit board.

One problem, however, with the above-described integrated circuit package 10 is that it is difficult to desolder from a printed circuit board. This problem occurs because the package has so many input/output pins. In FIG. 1, the package has 140 pins; and the trend in the semiconductor industry is for the number of pins to increase. With a large number of pins, heating the solder around each pin individually with a soldering iron and removing the melted solder individually with a solder sucker simply takes too long. Also, any removal process heats the printed circuit board in the area near the pins. This often causes conductors in that area of the board to delaminate or causes insulation resistance failures in the board.

Another problem with the prior art package 10 and systems which are made of the same is that they are inherently expensive. Some of the expense items are the cost of the input/output pins 16, the cost of the ceramic layers 11, and the cost of the heat sink. Another expense item is the high cost of equipment that is required to fabricate the package. This equipment includes a press and a high temperature furnace which are required to respectively laminate and cure the ceramic 11.

Still another problem with package 10 is the limitation that it places on the speed at which electrical signals travel between two die 13 in a system. In part, this limitation is due to capacitive coupling between the conductors 15 and the surrounding ceramic 11. This coupling causes a time delay Td for signals traveling from the pins 15 to the die 13 which equals $1.016 (ER)^{-\frac{1}{2}}$ nanoseconds per foot, where ER is the dielectric constant of the ceramic. In addition, package 10 is inherently larger than die 13. Thus, package 10 increases the distance which signals between two die in a system must travel, and that further limits the system's speed.

Accordingly, a primary object of the invention is to provide an improved assembly of intercoupled integrated circuit die.

Another object of the invention is to provide an assembly of intercoupled integrated circuit die which is easy to repair, low in cost, and high in speed of operation.

BRIEF SUMMARY OF THE INVENTION

These objects and others are achieved in accordance with the invention by an assembly of intercoupled integrated circuit die which comprises: a substrate having a plurality of holes which extend through the substrate; each hole is of a size that is suitable to receive an integrated circuit die; a plurality of independent subassemblies are also provided; each subassembly includes an integrated circuit die and a heat sink which is attached to the back of the die and extends beyond it; each subassembly is aligned with a respective hole in the substrate such that the die lies in the hole and the heat sink extends beyond the hole and attaches to the substrate; subassemblies are interconnected by printed conductors on the substrate and discrete wires that are bonded from the front of the die to the conductors; and the die and heat sink have similar thermal expansion coefficients, while the substrate has a substantially different thermal expansion coefficient.

BRIEF DESCRIPTION OF THE DRAWINGS

Various features and advantages of the invention are described herein in conjunction with the drawings wherein.

DETAILED DESCRIPTION OF THE INVENTION

Figure 2:
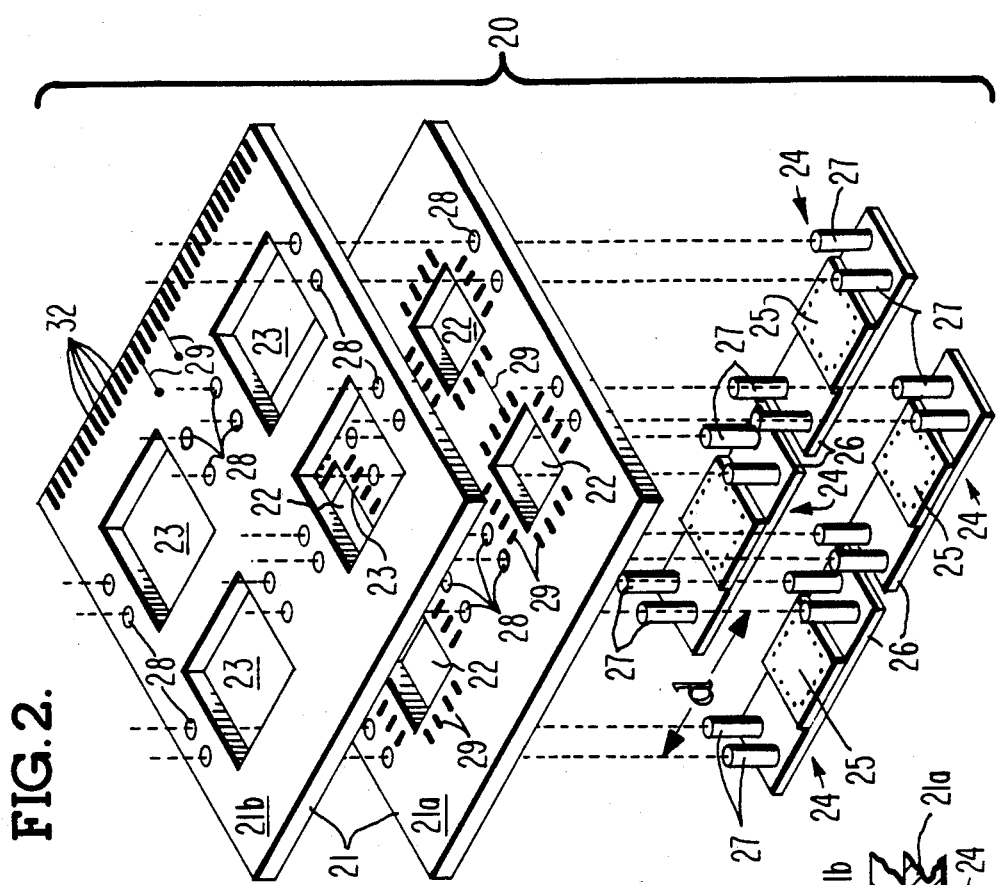
FIG. 2 is an exploded pictorial view of an assembly of intercoupled integrated circuit die that is constructed according to the invention.
Figure 3:
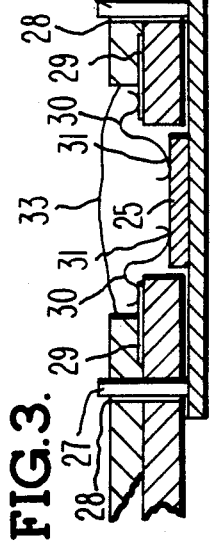
FIG. 3 is an enlarged sectional view taken through a portion of the assembly of FIG. 2.

Referring now to FIGS. 2 and 3, a preferred embodiment of an electromechanical assembly 20 that is constructed according to the invention will be described in detail. Assembly 20 includes a two-layer epoxy glass substrate 21. Layer 21a (the bottom layer) has a plurality of holes 22 each of which are slightly larger than an integrated circuit die. Layer 21b (the top layer) has a corresponding plurality of holes 23 which are aligned with and slightly larger than the holes 22.

Also included in assembly 20 is a plurality of independent subassemblies 24 each of which contains an integrated circuit die 25 and a heat sink 26. Die 25 has its back surface attached by an adhesive such as gold eutectic to heat sink 26. Heat sink 26 is rectangular in shape; its width can match the width of die 25 or extend beyond it if greater cooling is desired; and its length always extends beyond the length of die 25 in order to accommodate four posts 27.

Each of the subassemblies 24 is aligned with a respective hole in substrate 21 such that the die 25 lies in the hole and the heat sink 26 extends along its length beyond the hole and attaches to the substrate. To hold each subassembly 24 in place, the four posts 27 attach to the heat sink 26 and extend through bores 28 in the substrate 21. Solder is used to hold the posts 27 in the bores 28. A dissolvable encapsulant, such as X1-4939 silicone dielectric gel from Dow Corning covers and protects each die 25 in its hole.

To carry signals from one die 25 to another, printed conductors 29 are delineated on layers 21a and 21b. Discrete wires 30 are then bonded between bonding pads 31 on the die 25 and the conductors 29. Preferably, one of the conductors 29 carries a bias voltage (e.g., ground) to a post 27 which in turn biases die 25. Some of the conductors 29 are also routed to input/output pins 32 on the edge of layers 21a and 21b to thereby enable die on different assemblies to be interconnected via a backplane.

Heat sink 26 is made of a material whose thermal coefficient of expansion (TCE) is similar to that of the silicon die 25, i.e.—within 20%. Suitably, this is achieved by constructing heat sink 25 of a copper-invar-copper sandwich from Texas Instruments Corporation which has a TCE of 6-7 ppm/° C. By comparison, substrate 21 is made of a material which has a substantially different TCE, i.e.—different by at least 200%. Epoxy glass, for example, has a TCE of 16 ppm/° C. Despite this thermal mismatch, however, the subassemblies 24 are held in place by the posts 27, and the discrete wires 30 have sufficient slack to allow for any thermal expansion and contraction.

One feature of the above described assembly 20 is the ease with which defective die are repaired. In such a repair, a soldering iron and solder sucker are used to dissolve and remove solder around the four posts 27 of the subassembly 24 that contains the defective die. Then the encapsulant 33 is dissolved and the bonding wires 30 are cut from the die. This allows the defective subassembly to be removed and replaced by a new working subassembly. Bonding discrete wires 30 between the conductors 29 and the bonding pads 31 on the new subassembly is performed at a field service center.

Figure 1:
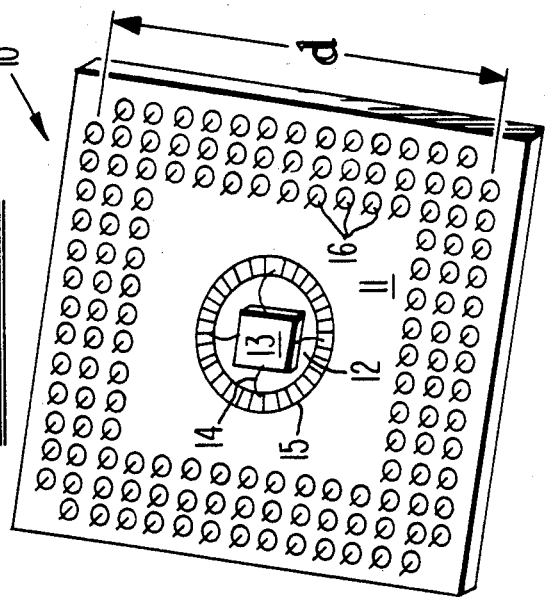
FIG. 1 is a pictorial view for comparison purposes of an integrated circuit package of the prior art.

Another feature of assembly 20 is its low manufacturing cost. In comparison to the prior art package 20 of FIG. 1, assembly 20 includes no input/output pins 16, and no ceramic layers 11. Also it needs no socket to be repairable. Thus the cost of those materials plus the cost of the press and furnace that operate on the ceramic is eliminated.

Still another feature of assembly 20 is its high speed of operation. All of the printed conductors 29 in assembly 20 are surrounded by epoxy glass layers 21a and 21b; and epoxy glass has a dielectric constant ER of only 4.2. Ceramic, by comparison, has a dielectric constant of 9.6. Thus, the time delay (Td) of a signal through a given length conductor 29 in assembly 20 is less than half the delay through a conductor 15 of the same length in package 10.

In addition, assembly 20 enables the length of conductor 29 between two different die 25 to be very short. This is because the width of heat sink 26 can match or extend only slightly beyond the width of die 25 which allows two die to be placed nearly side by side. In one actual assembly, die 25 is $\frac{1}{4}$ inch square and heat sink 26 is $\frac{3}{8} \times 1\frac{1}{4}$ inch. This allows two die to be placed th $\frac{1}{8}$ inch of each other. By comparison, the prior art package 10 of FIG. 1 does not allow such close spacing of two die because the pins 16 take too much space.

Yet another feature of assembly 20 is the reduced amount of thermal stress that it is subjected to in its operation. This reduced stress is due to the fact that the distance d between the posts 27 on heat sink 24 is small—it need only be slightly larger than die 25. By comparison, the distance d between the outermost pins of the prior art package 10 must be substantially larger than die 25 in order to make room for all of the other pins. For example, the distance between the outermost pins of a 68 pin package 10 is 1.20 inches whereas the lengthwise distance between posts of package 20 is only 0.63 inches. Thermal stress in both cases is directly proportional to distance d.

A preferred embodiment of the invention has now been described in detail. In addition, many changes and modifications can be made to this embodiment without departing from the nature and spirit of the invention. For example, substrate 21 can have more than two layers. Also, to reduce the cost of the assembly, the posts 27 can be eliminated, in which case the subassembly is held in place by an adhesive between heat sink 26 and substrate member 21a. Further, only a thin layer (e.g., a 20 mil thick layer) of the encapsulant 31 can be spread over die 25, and a lid placed over each hole 23 in substrate member 21b. Suitably, the lid can be made of plastic and held in place by an adhesive. Accordingly, since many such changes may be made, it is to be understood that the invention is not limited to said details but is defined by the appended claims.

What is claimed is:

1. An electromechanical assembly of integrated circuit die, comprising:
    a plurality of independent subassemblies each of which consists of just one of said die having its backside attached directly to a single plate of a single type of material and a plurality of posts which extend perpendicular from said plate around said one die;
    a substrate having a plurality of spaced apart holes each of which is only slightly larger than a single die and having several smaller bores around each of said holes;
    said subassemblies being arranged such that each die lies in a respective hole and the posts of each subassembly are fitted into the bores around said respective holes;
    said plate of each subassembly having a single thermal expansion coefficient which is essentially the same as the expansion coefficient of said die and substantially different than the expansion coefficient of said substrate;
    said posts in each subassembly being spaced by a distance which is no more than slightly larger than a single die; and
    said substrate having conductors which are connected by discrete bonding wires to the frontside of said die to carry signals thereto, and having another conductor connected to a respective post on each subassembly to carry a bias voltage to the backside of said die.

2. An assembly according to claim 1 wherein said subassemblies are attached to said substrate by an adhesive between said posts and said substrate.

3. An assembly according to claim 1 wherein the respective thermal expansion coefficients of said substrate and said plate differ by a factor of at least two.

4. An assembly according to claim 1 wherein said substrate is made of an epoxy glass having a dielectric constant of less than five.

5. An assembly according to claim 1 which further includes signal pins which are on said substrate and which are connected to said conductors for inserting said assembly into a backplane.

6. An assembly according to claim 1 wherein the space between two holes for said die and the length of said conductors that interconnect the die in said two holes is less than one inch.

7. An assembly according to claim 1 wherein said plate is rectangular and is longer than but the same width as said die.

8. An assembly according to 1 wherein said integrated circuit die and said plate of each subassembly have respective thermal expansion coefficients which are within 20 % of each other, and said substrate has a thermal expansion coefficient which differs by at least 200% from said respective thermal coefficients.

* * * * *